United States Patent
Chung et al.

(10) Patent No.: US 9,786,843 B2
(45) Date of Patent: Oct. 10, 2017

(54) METHODS FOR FABRICATING AN OPTOELECTRONIC DEVICE

(71) Applicant: Inktec Co., Ltd., Ansan (KR)

(72) Inventors: Kwang Choon Chung, Yongin-si (KR); Hyun Nam Cho, Gunpo-si (KR); Ji Hoon Yoo, Bucheon-si (KR)

(73) Assignee: Inktec Co., Ltd., Kyeongki-do (KR)

( * ) Notice: Subject to any disclaimer, the term of this patent is extended or adjusted under 35 U.S.C. 154(b) by 185 days.

(21) Appl. No.: 14/107,620

(22) Filed: Dec. 16, 2013

(65) Prior Publication Data

US 2014/0106492 A1 Apr. 17, 2014

Related U.S. Application Data

(62) Division of application No. 12/936,871, filed as application No. PCT/KR2009/001782 on Apr. 7, 2009, now abandoned.

(30) Foreign Application Priority Data

Apr. 10, 2008 (KR) .................. 10-2008-0033386

(51) Int. Cl.
*B05D 5/12* (2006.01)
*H01L 51/00* (2006.01)
*C09D 11/03* (2014.01)
*C09D 11/38* (2014.01)

(52) U.S. Cl.
CPC .......... *H01L 51/0004* (2013.01); *C09D 11/03* (2013.01); *C09D 11/38* (2013.01); *H01L 51/0007* (2013.01); *H01L 51/0005* (2013.01); *H01L 51/0037* (2013.01); *Y02E 10/549* (2013.01); *Y02P 70/521* (2015.11)

(58) Field of Classification Search
USPC .......................................... 427/66
See application file for complete search history.

(56) References Cited

U.S. PATENT DOCUMENTS

| | | | |
|---|---|---|---|
| 4,600,598 A | 7/1986 | Nelson et al. | |
| 6,288,141 B1 | 9/2001 | Malhotra | |
| 6,334,890 B1 | 1/2002 | Goodbrand et al. | |
| 2003/0052616 A1* | 3/2003 | Antoniadis | H01L 27/3211 |
| | | | 315/169.3 |
| 2003/0172841 A1 | 9/2003 | Titterington et al. | |
| 2004/0009368 A1* | 1/2004 | Otani | C07D 487/04 |
| | | | 428/690 |
| 2008/0174643 A1 | 7/2008 | Notoya et al. | |
| 2008/0277381 A1* | 11/2008 | Chung | C09K 13/00 |
| | | | 216/94 |
| 2009/0274834 A1* | 11/2009 | Chopra | C09D 11/52 |
| | | | 427/125 |
| 2010/0189901 A1 | 7/2010 | Chung et al. | |

FOREIGN PATENT DOCUMENTS

| | | | |
|---|---|---|---|
| JP | 61163975 | | 7/1986 |
| JP | 06248212 | | 9/1994 |
| JP | 2002313567 A | | 10/2002 |
| KR | 1020050022188 A | | 3/2005 |
| KR | 1020060071388 B1 | | 2/2008 |
| KR | 1020080013207 | | 2/2008 |
| TW | 200812730 | | 3/2008 |
| WO | WO 2006/083153 | * | 8/2006 |
| WO | 2006093398 A1 | | 9/2006 |
| WO | WO 2006/093398 | * | 9/2006 |
| WO | 2006107176 A1 | | 10/2006 |
| WO | 2008018718 A1 | | 2/2008 |

OTHER PUBLICATIONS

H.B. Wright et al., "Reactions of Aralkyl Amines with Carbon Dioxide," JACS, 1948, 3865-3866, 70(11).
Von E. Leibnitz et al., "Inhaltsstoffe technischer Fettamingemische aus PO-Fettsauren," Journal fur praktiskhe Chemie, Dec. 1959, 217-231, 4 Reihe, Band 9.
T. R. Hebner et al., "Ink-jet printing of doped polymers for organic light emitting devices," Applied Physics Letters, Feb. 2, 1998, 519-521, vol. 72, No. 5.
Mathew George et al., "Chemically Reversible Organogels: Aliphatic Amines as "latent" Gelators with Carbon Dioxide," J. Am. Chem. Soc., 2001, 10393-10394, 123.
Mathew George et al., "Chemically Reversible Organogels via "Latent" Gelators. Aliphatic Amines with Carbon Dioxide and Their Ammonium Carbamates", Langmuir, Jun. 13, 2002, 7124-7135, vol. 18 No. 19.

* cited by examiner

*Primary Examiner* — Austin Murata
(74) *Attorney, Agent, or Firm* — The Webb Law Firm

(57) ABSTRACT

The invention relates to methods for fabricating an optoelectronic device, including: directly applying a printing ink composition to a patterning process, wherein the printing ink composition includes (1) at least one compound selected from the group of compounds represented by Chemical Formula 1, Chemical Formula 2, Chemical Formula 3, and mixtures thereof as disclosed herein in an amount of 0.01-90 wt % based on the total weight of the composition and (2) at least one material for an optoelectronic device.

8 Claims, 2 Drawing Sheets

METHODS FOR FABRICATING AN OPTOELECTRONIC DEVICE

CROSS-REFERENCE TO RELATED APPLICATIONS

This application is a division of U.S. patent application Ser. No. 12/936,871, which is the national phase of PCT/KR2009/001782 filed Apr. 7, 2009 and claims priority to Republic of Korea Patent Application No. 10-2008-0033386, filed Apr. 10, 2008, the entire disclosures of which are herein incorporated by reference.

TECHNICAL FIELD

The following disclosure relates to a printing ink composition directly applicable to a patterning process, obtained by forming materials for optoelectronic device into ink, and more particularly, to a printing ink composition for fabricating optoelectronic device obtained by controlling physical properties of key materials for fabricating optoelectronic devicesoptoelectronic device, including organic light emitting diodes (OLEDs) or organic thin film transistors (OTFTs), to be amenable to a printing process and to allow direct patterning.

BACKGROUND

Recently, optoelectronic device has been succeeded in commercialization and studied intensively for their scale-up and cost-efficient fabrication. Typical examples of such optoelectronic device include organic electroluminescent devices or organic light emitting diodes (OLEDs), which are light emitting devices using a spontaneous light emitting phenomenon caused by coupling between electrons and holes upon the application of electric current to a device including a fluorescence- or phosphorescence-based light emitting layer between an anode and a cathode. Such OLEDs have a simple structure, are obtained by a simple process, and realize high image quality and a broad view angle. Further, they completely realize video images and high color purity, are driven with low power consumption under a low voltage, and thus are suitable for portable electronic appliances.

More particularly, an OLED includes an anode, a hole injection layer, a hole transfer layer, an emitting layer, an electron transfer layer, an electron injection layer and a cathode, stacked successively on a substrate. Herein, the anode is frequently allied of indium tin oxide (ITO) having a low surface resistance and high transmittance. In addition, multiple organic thin films are disposed between the two electrodes as described above to increase the light emitting efficiency and lifespan. Since the organic thin films are very weak to moisture and oxygen in the air, an encapsulating film is formed on the uppermost portion of the device to increase the lifespan thereof.

Many expensive vacuum chambers are required to form such a multilayered OLED with high efficiency and a patterning mask is also required. Moreover, processes for fabricating OLEDs have fundamental limitation in terms of low-temperature operation. For these reasons, it is difficult to scale up OLEDs in their size and to improve cost efficiency. Therefore, there has been a continuous need for developing a novel process to solve the above-mentioned problems.

More recently, many attempts have been made to overcome the above-mentioned problems through the use of a printing process. For example, an inkjet printing process substituting for a known deposition process is differentiated from the deposition process in that it consumes a low amount of materials, shows high efficiency, and allows scale-up and low-temperature operation. Therefore, flexible substrates, such as plastics, may be used in an inkjet printing process, resulting in significant improvement in cost-efficiency. As a result, many Korean and foreign companies and organizations have conducted active research and development of such inkjet printing processes. It is expected that inkjet printing technology is applied to various industrial fields, including electric/electronic, energy, display, bioindustries, etc., and contributes to production of a wide variety of commercial products and improvement in cost-efficiency and eco-friendly characteristics.

Inkjet printing is low-noise, low-cost and non-contact printing technology. Depending on ink spray modes, inkjet printing processes are classified into continuous jet processes and drop-on-demand (DOD) processes. The continuous jet processes performs printing by controlling ink direction through a change in electromagnetic field while ink is sprayed continuously with a pump. The DOD processes spray ink only at a desired moment through electrical signals, and are further classified into piezoelectric inkjet processes generating pressure with a piezoelectric plate that causes dynamic deformation by electricity, and thermal inkjet processes using pressure generated upon the expansion of bubbles produced by heat.

Methods for fabricating OLEDs using such inkjet processes are disclosed in various publications, for example, in T. R. Hebner, C. C. Wu, D. Marcy, M. H. Lu and J. C. Stunn,-"Ink-jet Printing of doped Polymers for Organic Light Emitting Devices", *Applied Physics Letters*, Vol. 72, No. 5, pp. 519-521, 1998. The known methods frequently use polymeric materials, such as polyvinylcarbazole or polyphenylene vinylene (PPV), but are problematic in that they cause non-uniformity of droplet sizes and degradation of optoelectrical properties as compared to other conventional processes. This may result from the fact that the known processes may not provide an ink composition for inkjet printing that has controllable viscosity, surface tension, solubility, film uniformity after drying, etc., suitable for inkjet processes.

It is required for an ink composition for applying key materials, such as organic materials for light emission, electron transfer or hole transfer, of optoelectronic device, including OLEDs, to inkjet printing processes, to have optimized viscosity, surface tension, solubility, film uniformity after drying, etc. Those properties may affect droplet forming systems, droplet sizes and velocities under a constant pressure. For example, when using a general inkjet system for optoelectronic device, an optimal viscosity of ink is 5-15 cps in view of good ejectability. However, most high-efficiency and high-lifespan compounds commercialized and used currently as key materials of OLEDs have low solubility and small molecular weight, and thus have difficulty in controlling their viscosity to be suitable for inkjet printing processes. For this reason, various additives are used to control the viscosity and tested for ejectability. However, some additives are not removed after drying but still remain in ink to serve as foreign materials, thereby adversely affecting electrical and optical properties, or the like. As a result, it is not possible to maintain a unique color coordination, high efficiency and long lifespan. In addition, it is difficult to control the solubility and molecular weights of organic materials, such as dielectrics, semiconductors and conductors, used as key materials of organic thin film transistor (OTFT) in view of physical properties required for inkjet printing. Conventional inkjet processes using various additives result in degradation of dielectric coefficient, charge transfer and conductivity due to the impurities remaining after the fabrication of devices.

Korean Patent Laid-Open No. 2003-0058767 discloses a method for improving the printability of an organic light emitting layer for OLEDs formed by a roll coating process. The method uses, as a solvent, a mixture containing a first solvent having a solubility of 1 wt/v %, a second solvent having a volatility of 0.1 or less and a third solvent having a surface tension of 30 dynes/cm or less, to prevent solvent evaporation before coating a substrate and to improve solubility and surface tension. However, the above method is merely limited to improvement in solubility characteristics of organic polymer materials used for a specific process, does not allow selection of an adequate combination of solvents depending on different kinds of organic polymer materials, and have difficulty in controlling viscosity suitable for a printing process. Therefore, the method is not applicable to various materials for fabricating optoelectronic device.

As stated above, ink compositions for fabricating optoelectronic device according to the related art have difficulty in controlling viscosity, solubility and film uniformity so that the ink compositions are applicable to printing processes, such as inkjet processes. Therefore, processes for forming films via printing of optoelectronic materials provided as ink have been limited to formation of certain organic light emitting layers. As a result, there has been marked limitation in realizing flexible optoelectronic device, and scale-up and cost-efficient fabrication thereof.

DETAILED DESCRIPTION

Technical Problems

An embodiment of the present invention is directed to providing an ink composition for printing key materials of optoelectronic device, such as organic light emitting diodes (OLEDs) or organic thin film transistors (OTFTs), in the form of ink, the printing ink composition including a compound with a specific structure to control the viscosity, solubility and film uniformity of ink, wherein the compound is decomposed easily at a sufficiently low temperature and does not adversely affect the characteristics of the resultant optoelectronic device.

Another embodiment of the present invention is directed to applying the printing ink composition to various key materials of optoelectronic device, so that it allows fabrication of flexible devices and scale-up of devices, and improves cost-efficiency.

Technical Solutions

We have conducted intensive studies to solve the technical problems, and found that when an ammonium carbamate compound or ammonium carbonate compound is incorporated to a printing ink composition for optoelectronic device, such as organic light emitting device (OLED) or organic thin film transistor (OTFT), it is possible to control the viscosity, solubility and film uniformity of ink with ease. In addition, the ammonium carbamate compound or ammonium carbonate compound used herein is decomposed spontaneously at a sufficiently low temperature, and thus does not adversely affect the quality of the resultant device. Therefore, many compounds having excellent efficiency and lifespan, which, otherwise, are not applicable to printing ink, may be formed into ink suitable for a printing process. As a result, it is possible to provide flexible devices, to realize scale-up of devices, and to improve cost-efficiency.

In one general aspect, there is provided a printing ink composition directly applicable to a patterning process, obtained by forming materials for optoelectronic device into ink. More particularly, there is provided a printing ink composition for printing key materials of optoelectronic device, such as OLED or OTFT, in the form of ink, the printing ink composition including: an ammonium carbamate compound represented by Chemical Formula 1, ammonium carbonate compound represented by Chemical Formula 2, ammonium bicarbonate compound represented by Chemical Formula 3, or a mixture thereof.

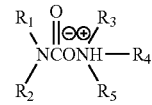

[Chemical Formula 1]

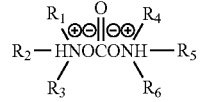

[Chemical Formula 2]

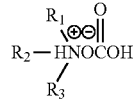

[Chemical Formula 3]

In the above Chemical Formulae 1 to 3, $R_1$ through $R_6$ is independently selected from hydrogen, hydroxy, $C_1$-$C_{30}$ alkoxy, $C_1$-$C_{30}$ alkyl, $C_3$-$C_{30}$ cycloalkyl, $C_6$-$C_{20}$ aryl, ($C_6$-$C_{20}$)ar($C_1$-$C_{30}$)alkyl, functional group-substituted $C_1$-$C_{30}$ alkyl, functional group-substituted $C_6$-$C_{20}$ aryl, heterocyclic compound, polymeric compound and a derivative thereof, wherein when $R_1$ through $R_6$ represents alkyl or aralkyl non-substituted or substituted with a functional group, carbon chain may include a heteroatom selected from N, S and O, and $R_1$ and $R_2$, or $R_4$ and $R_5$ may be independently linked to each other via alkylene with or without a heteroatom to form a ring.

In Chemical Formulae 1 to 3, particular examples of $R_1$ through $R_6$ include but are not limited to hydrogen, methyl, ethyl, propyl, isopropyl, butyl, isobutyl, amyl, hexyl, ethylhexyl, heptyl, octyl, isooctyl, nonyl, decyl, dodecyl, hexadecyl, octadecyl, docodecyl, cyclopropyl, cyclopentyl, cyclohexyl, cholesteryl, allyl, hydroxy, methoxy, methoxyethyl, methoxypropyl, cyanoethyl, ethoxy, butoxy, hexyloxy, methoxyethoxyethyl, methoxyethoxyethoxyethyl, hexametyleneimine, morpholine, piperidine, piperazine, ethylenediamine, propylenediamine, hexamethylenediamine, triethylenediamine, pyrrole, imidazole, pyridine, carboxymethyl, trimethoxysilylpropyl, triethoxysilylpropyl, phenyl, methoxyphenyl, cyanophenyl, phenoxy, tolyl, benzyl and derivatives thereof, polymeric compounds such as polyallylamine or polyethyleneimine and derivatives thereof.

Particular examples of the ammonium carbamate compound of Chemical Formula 1 include at least one compound selected from the group consisting of ammonium carbamate, ethylammonium ethylcarbamate, isopropylammonium isopropylcarbamate, n-butylammonium n-butylcarbamate, isobutylammonium isobutylcarbamate, t-butylammonium t-butylcarbamate, 2-ethylhexylammonium 2-ethylhexylcarbamate, octadecylammonium octadecylcarbamate, 2-methoxyethylammonium 2-methoxyethylcarbamate, 2-cyanoethylammonium 2-cyanoethylcarbamate, dibutylammonium dibutylcarbamate, dioctadecylammonium dioctadecylcarbamate, methyldecylammonium methyldecylcarbamate, hexamethyleneimineammonium hexamethyleneiminecarbamate, morpholinium morpholinecarbamate, pyridinium ethylhexylcarbamate, triethylenediaminium isopropylbicarbamate, benzylammonium benzylcarbamate, triethoxysilylpropylammonium triethoxysilylpropylcarbamate and derivatives thereof, or a mixture thereof. Particular examples of the ammonium carbonate compound of Chemical Formula 2 include at least one compound selected from the group consisting of ammonium carbonate, ethylammonium ethyl carbonate, isopropylammonium isopropylcarbonate, n-butyl ammonium n-butylcarbonate, isobutylammonium isobutylcarbonate, t-butylammonium t-butylcarbonate, 2-ethylhexylammonium 2-ethylhexylcarbonate, 2-methoxyethylammonium 2-methoxyethylcarbonate, 2-cyanoethylammonium 2-cyanoethylcarbonate, octadecylammonium octadecylcarbonate, dibutylammonium dibutylcarbonate, dioctadecylammonium dioctadecylcarbonate, methyldecylammonium methyldecylcarbonate, hexamethyleneimineammonium hexamethyleneiminecarbonate, morpholineammonium morpholinecarbonate, benzylammonium benzylcarbonate, triethoxysilylpropylammonium triethoxysilylpropylcarbonate, triethylenediaminium isopropylcarbonate and derivatives thereof, or a mixture thereof. Particular examples of the ammonium bicarbonate compound of Chemical Formula 3 include at least one compound selected from the group consisting of ammonium bicarbonate, isopropylammonium bicarbonate, t-butylammonium bicarbonate, 2-ethylhexylammonium bicarbonate, 2-methoxyethylammonium bicarbonate, 2-cyanoethylammonium bicarbonate, dioctadecylammonium bicarbonate, pyridinium bicarbonate, triethylenediaminium bicarbonate and derivatives thereof, or a mixture thereof.

In the compounds represented by Chemical Formulae 1 to 3, at least one of substituents $R_1$ through $R_6$ preferably has 1-20 carbon atoms, and more preferably 3-20 carbon atoms in view of miscibility with organic solvents and decomposition capability at low temperature.

The ammonium carbamate or ammonium carbonate compounds may be prepared by any one of processes known to those skilled in the art. For example, *J. Am. Chem. Soc.*, 70, p3865 (1948), *J. Am. Chem. Soc.*, 73, p1820 (1951), *J. Prakt. Chem.*, 9, p917 (1959), *J. Am. Chem. Soc.*, 123, p10393 (2001), *Langmuir*, 18, 7124 (2002), and U.S. Pat. No. 4,542,214 (Sep. 17, 1985) disclose that such compounds may be prepared from a primary amine, secondary amine, tertiary amine or a mixture thereof and carbon dioxide. The preparation may be carried out under ambient pressure or increased pressure, without any solvent or in the presence of solvent. Particular examples of the solvent that may be used include alcohols such as methanol, ethanol, isopropanol or butanol, glycols such as ethylene glycol or glycerine, acetates such as ethyl acetate, butyl acetate or carbitol acetate, ethers such as diethyl ether, tetrahydrofuran or dioxane, ketones such as methyl ethyl ketone or acetone, aliphatic hydrocarbons such as hexane or heptane, aromatic hydrocarbons such as benzene or toluene, halogenated hydrocarbons such as chloroform, methylene chloride or carbon tetrachloride, or the like. Carbon dioxide may be bubbled in a gas phase or may be provided as solid dry ice. Supercritical carbon dioxide may also be used.

In addition to the above-mentioned method, any methods for preparing ammonium carbamate or ammonium carbonate derivatives may be used as long as they provide a final product with the same structure as depicted above. In other words, there is no particular limitation in solvent, reaction temperature, concentration or catalyst, etc.

The compound represented by Chemical Formulae 1 to 3, or a mixture thereof may be used in the printing ink composition for fabricating optoelectronic device in any amount, as long as it provides the printing ink composition with desired characteristics. Typically, the compound may be used in an amount of 0.01-90 wt %, preferably 0.05-90 wt %, more preferably 0.1-70 wt %, based on the total weight of the printing ink composition. When the compound is used in an amount less than 0.01 wt %, it is not possible to obtain sufficient effects. On the other hand, when the compound is used in an amount greater than 90 wt %, it is not possible to obtain desired physical properties after forming a film, due to an excessive decrease in the amount of other components, including optoelectronic materials and solvent.

The printing ink composition for fabricating optoelectronic device disclosed herein may further include other additives, such as a solvent, stabilizer, dispersant, binder resin, reducing agent, surfactant, wetting agent, thixotropic agent or levelling agent, in addition to the compound represented by Chemical Formulae 1 to 3, or a mixture thereof.

There is no particular limitation in the solvent used in the printing ink composition, as long as it provides the printing ink composition with desired characteristics. Particular examples of the solvent that may be used include water, alcohols such as ethanol or methanol, glycols such as ethylene glycol, acetates such as methyl acetate or ethyl acetate, ethers such as diethyl ether, tetrahydrofuran, anisole or methyl anisole, ketones such as acetone, methyl ethyl ketone or acetophenone, aliphatic hydrocarbons such as hexane or heptane, aromatic hydrocarbons such as benzene, toluene, xylene or tetrahydronaphthalene, halogenated hydrocarbons such as methylene chloride, chloroform, carbon tetrachloride or chlorobenzene, or the like.

The printing ink composition disclosed herein includes materials for fabricating optoelectronic device. Any materials for fabricating OLEDs or OTFTs, optoelectronic functional materials, or organic materials, organic-inorganic hybrid materials or organometallic complexes used currently in conventional optoelectronic device may be used herein, as long as they are dissolved in a selected solvent. Particularly, various structural or functional materials, which, otherwise, are not suitable for forming ink applicable to direct pattern printing, may be used in the printing ink composition disclosed herein.

Particular examples of the materials for fabricating optoelectronic device include: polymers, such as homopolymers including polythiophene polymers, poly-p-phenylene polymers, poly-p-phenylenevinylene polymers, polyfluorene polymers, polycyano polymers, polyaniline polymers, polyquinoline polymers, polyvinylcarbazole (PVK) polymers, or polypyrrole polymers, and copolymers having two or more repeating units, including polyfluorenevinylene copolymers, polyspirofluorene copolymers, or polyarylaminevinylene copolymers, various polymer derivatives for use in increasing solubility, including PEDOT/PSS, electroluminescence polymers, including green light emitting polymers (SPG-020 available from Merck), or charge transfer polymer materials; and low-molecular weight materials, such as 4,4',4"-tris(N-(2-naphthyl)-N-phenylamino)-triphenylamine (2-TNATA) and derivatives thereof, 4,4',4"-tris(3-methylphenylphenylamino)-triphenylamine (m-MTDATA) and derivatives thereof, N,N'-bis(1-naphthyl)-N,N'-diphenyl-1,1'-biphenyl-4,4'-diamine (NPB) and derivatives thereof, tetraphenyldiaminediphenyl (TPD) and derivatives thereof, N,N,N',N'-tetra(2-naphthylphenyl)(1,1'-biphenyl)-4,4'-diamine (TNB) and derivatives thereof, tris(8-hydroxyquinalinato)aluminum (AlQ$_3$) and derivatives thereof, copper (II) phthalocyanine (CuPC) and derivatives thereof, 9,10-di(2-naphthyl)anthracene (ADN) and derivatives thereof, 1,4-bis(2,2-diphenylvinyl)biphenyl (DPVBi) and derivatives thereof, 1,3-bis[(p-tert-butyl)phenyl-1,3,4-oxadiazoyl]benzene (OXD-7) and derivatives thereof, 5,12-dihydro-5,12-dimethylquino[2,3-b]acridine-7,14-dione (DMAQ) and derivatives thereof, 4,4'-(bis(9-ethyl-3-carbazovinylene)-1,1'-biphenyl (DczVBi) and derivatives thereof, arylamine-substituted distrylarylene (DAS-amine) and derivatives thereof, 4-(dicyanomethylene)-2-methyl-6-(jurolidine-4-yl-vinyl)-4H-pyrane (DCM2) and derivatives thereof, 5,6,11,12-tetraphenylnaphthacene (Rubrene) and derivatives thereof, 4,4',4"-tris(carbazole-9-yl)-triphenylamine (TCTA) and derivatives thereof, 4,4'-bis(carbazole-9-yl)biphenyl (CBP) and derivatives thereof, bis-(2-methyl-8-quinolinolato)-4-(phenolato)aluminum (III) (BAlq) and derivatives thereof, 2-(4-biphenylyl)-5-(p-tert-butylphenyl)-1,3,4-oxadiazole (PBD) and derivatives thereof, 2,9-dimethyl-4,7-diphenyl-1,10-phenanthroline (BCP) and derivatives thereof, 10-(2-benzothiazolyl)-1,1,7,7-tetramethyl-2,3,6,7-tetrahydro-1H,5H,11H-[1]benzopyrano[6,7,8-ij]quinolizine-11-one (C-545T) and derivatives thereof, 4-(dicyanomethyl)-2-tert-butyl-6-(1,1,7,7-tetramethyljulolidine-4-yl-vinyl)-4H-pyran (DCJTB) and derivatives thereof, 2,2',2"-(1,3,5-phenylene)tris(1-phenyl-1H-benzimidazole) (TPBI) and derivatives thereof, tris[2-(2-pyridinyl)phenyl-C,N]-iridium (Ir(ppy)$_3$) and derivatives thereof, bis(2-(2'-benzothienyl)-pyridinato-N,C-3')iridium(acetylacetonate) (btp$_2$Ir [acac]) and derivatives thereof, bis(2-(4,6-difluorophenyl)pyridinato-N,C-2')iridium(picolinate) (Flrpic) and derivatives thereof, platinum (II) octaethylporphyrine (PtOEP) and derivatives thereof, 2,6-bis(4-carbazolstyryl) ethylhexylanisole and derivatives thereof, and other materials soluble in a selected solvent.

Typical examples of the key materials of OLEDs, including light emitting materials, hole injection materials, hole transfer materials, electron transfer materials and electron injection materials, and those of OTFTs, including organic semiconductor materials, conductive polymer materials and dielectric materials are shown in Table 1.

In addition to the key material of OLED and OTFT, other important material for use in organic optoelectronic device may also be provided in the form of ink and applied to fabrication of device with ease. Particular example of such material include photodisk material, phtochromic material, photochemical hole burning (PHB) material, liquid crystal material, laser pigment material, linear or non-linear optical material, resist material, photosensitive material, photographic material, photoconductive material, organic photovoltaic material, electroconductive material, electrochromic material, ion conductive material, pyroelectric material, charge transfer complex material, dielectric material, piezoelectric material, sensor material, magnetic material, photoelectronic functional biomaterial, or other material that are not suitable for forming printing ink. Typical examples of such materials are shown in Table 2 as their structural formulae, which may be substituted with suitable substituents to improve the quality of a device, including adhesion and thin film properties.

TABLE 1

| | | Structure |
|---|---|---|
| OLED | Fluorescence polymer | |

TABLE 1-continued
| Structure |
| --- |
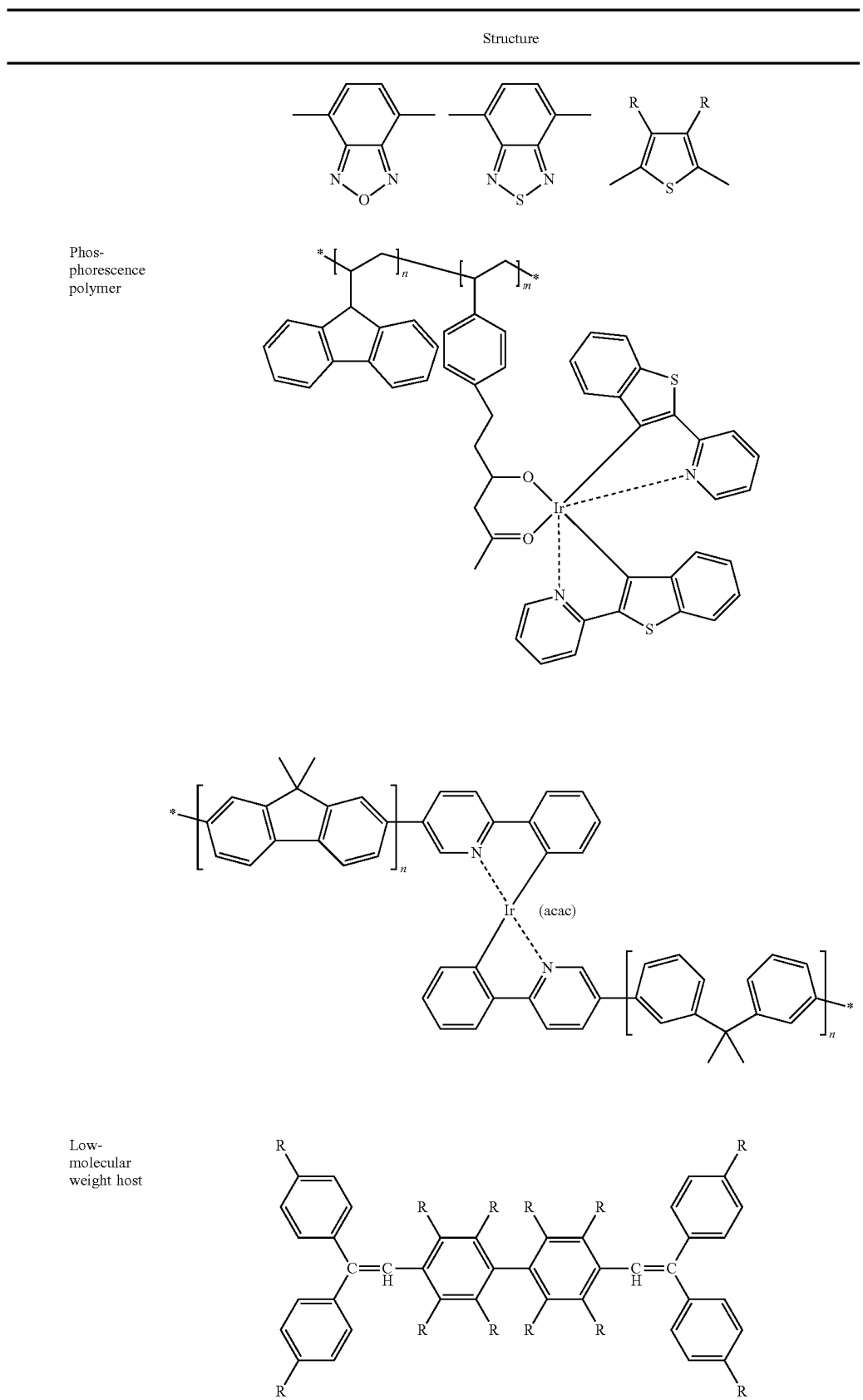

TABLE 1-continued
| Structure |
| --- |
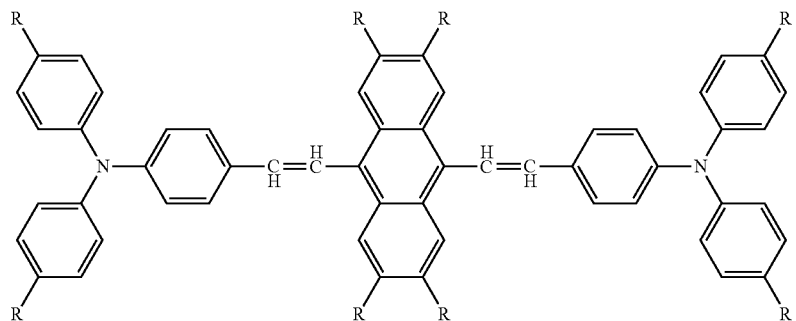
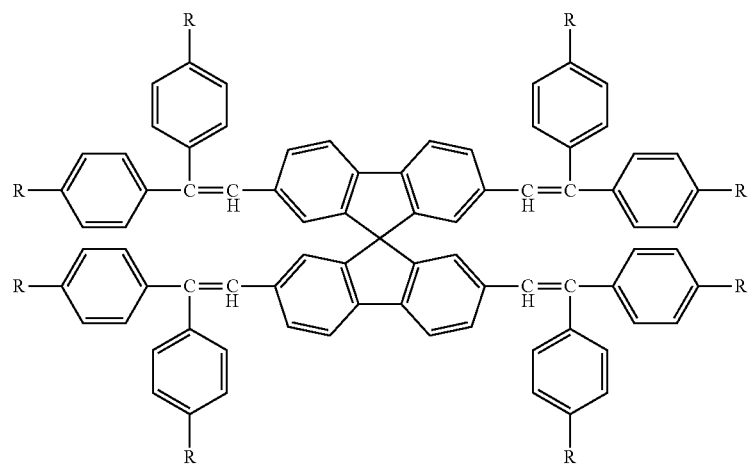
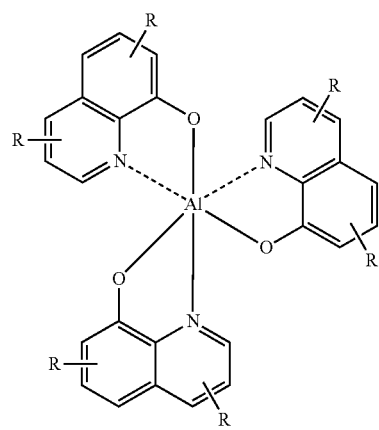
Low-molecular weight dopant
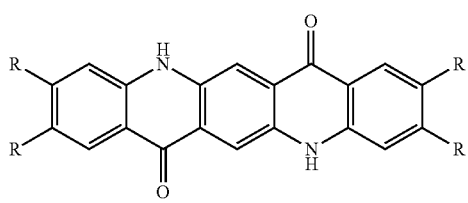

TABLE 1-continued
Structure
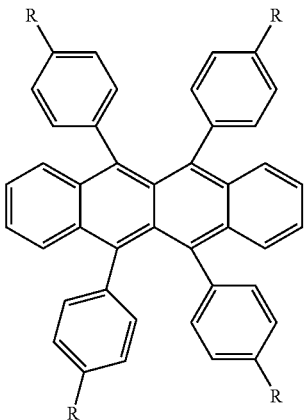
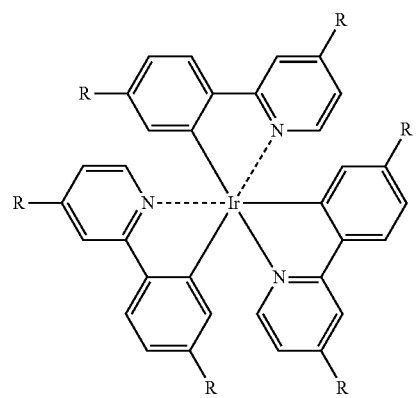
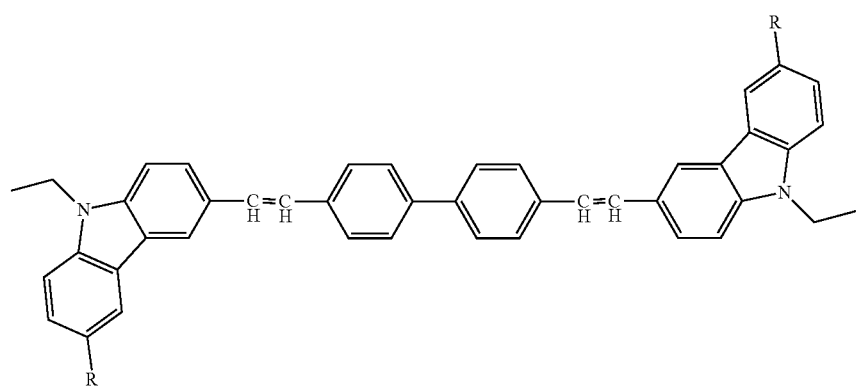
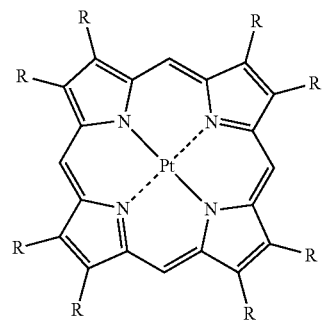

TABLE 1-continued
| Structure |
|---|
| Hole transfer materials 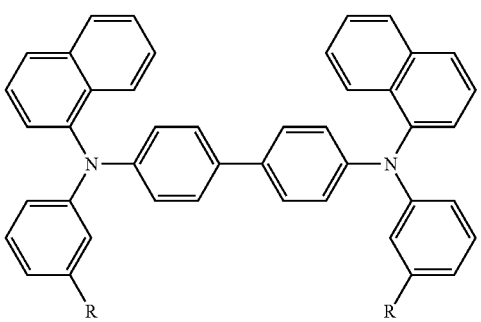 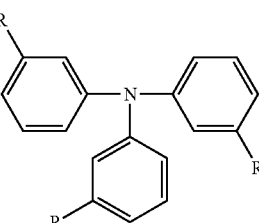 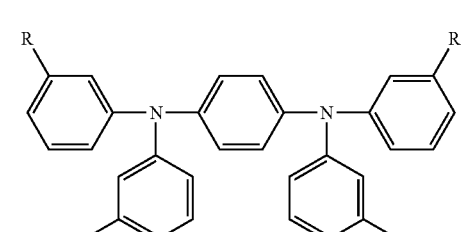 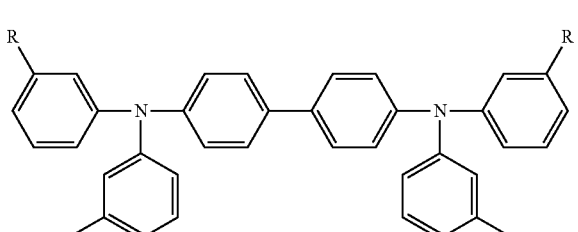 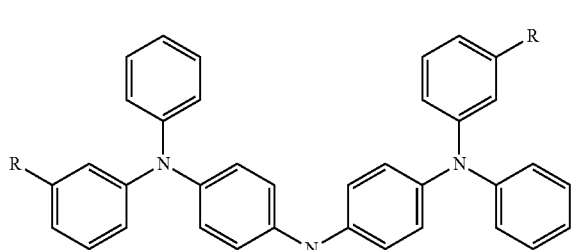 |

TABLE 1-continued

| Structure |
| --- |

Electron transfer materials

OTFT p-Type

TABLE 1-continued
| | Structure |
|---|---|
| | (sexithiophene with R groups) |
| n-Type | (naphthalene diimide with benzyl-R substituents) |
| | (perylene diimide with N–R substituents) |
| | (dicyanomethylene-terthiophene with R groups) |
| | (metal phthalocyanine M with R substituents) |
TABLE 2
| | | Structure |
|---|---|---|
| Optoelectronic functional organic materials | Photodisk materials |  |

TABLE 2-continued

| | Structure |
|---|---|
| Photochromic materials | (spiroindoline-naphthoxazine structure with R groups) |
| PHB materials | (Zn tetrabenzoporphyrin with four R-substituted phenyl groups) |
| Liquid crystal materials | $C_{10}H_{21}O$—C₆H₄—CH=N—C₆H₄—C₆H₄—CH=CH—C(=O)—O—CH₂—C*H(CH₃)—CH₂—CH₃<br><br>$C_7H_{15}$—(2,3-difluorophenyl)—C₆H₄—C₆H₄—$C_9H_{19}$ |
| Laser pigments | (Rhodamine B structure: xanthene with $C_2H_5NH$ and $=NC_2H_5^+$·H groups, two $CH_3$ groups, and $C_2H_5OOC$-phenyl substituent) |
| Optical materials | $*$—[C₆H₂(OR)(OR)—CH=CH—]$_n$—$*$<br><br>$R_2N$—C₆H₄—N=CH—(2,5-dichlorophenyl)—CH=N—C₆H₄—NR₂ (with $R$CH₂ groups on nitrogens) |

TABLE 2-continued
| | Structure |
|---|---|
| Resist materials | PMMA, PGMA 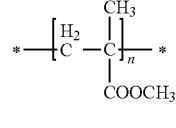 |
| Photosensitive materials | 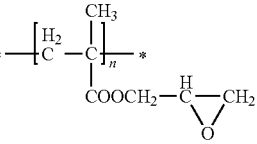 |
| Photographic materials | 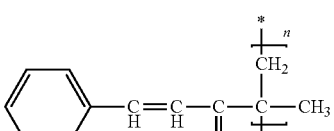 |
| Photoconductive materials | 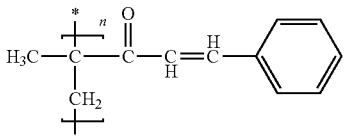 |
| Charge transfer complexes | 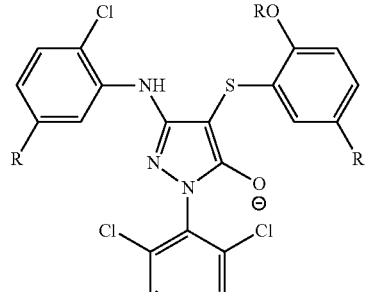 |

TABLE 2-continued
| | Structure |
|---|---|
| Ion conductors | 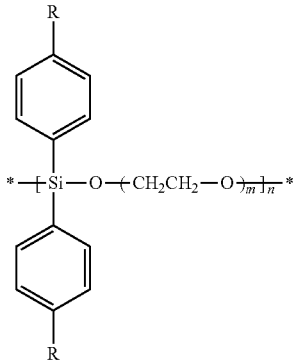 |
| Superconductors | 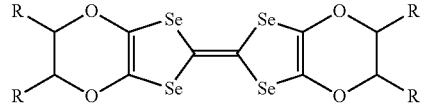 |
| Sensors | 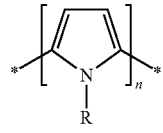 |
| Electrochromic materials | 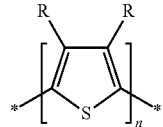 |
| Photovoltaic materials | 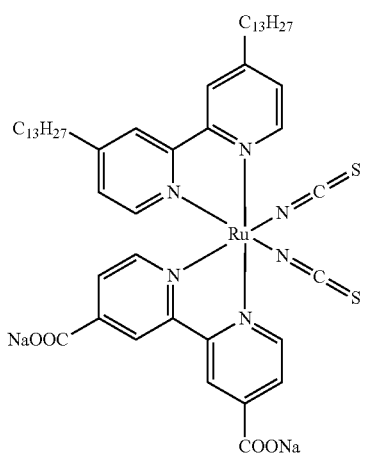 |

TABLE 2-continued

Structure

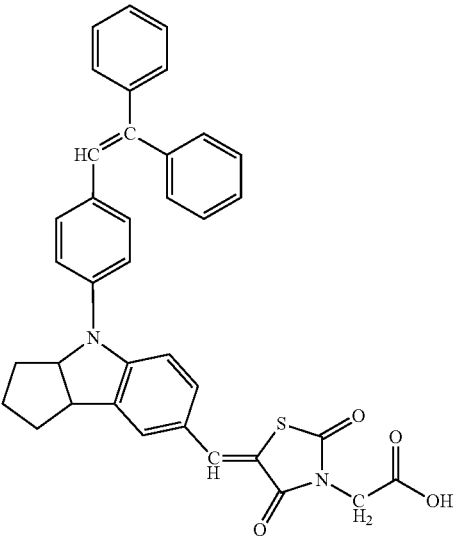 [SMILES: O=C(O)CN1C(=O)S/C(=C\c2ccc3c(c2)C2CCCC2N3c2ccc(C=C(c3ccccc3)c3ccccc3)cc2)C1=O]

In Table 1 and Table 2, each of n and m represents a positive integer, and R represents any substituent and particular examples of R include, but are not limited to alkyl, aryl, heteroaryl, alkoxy, alkylcarbonyl, trialkylsilylalkylcarbonyl, imine, ether, ester, nitrile, thioalkoxy, thioester, amino, vinyl, halogen atoms, or the like. As can be seen from Tables 1 and 2, materials for OLEDs or OTFTs may be provided as fluorescence materials, phosphorescence materials, charge transfer materials, electron transfer materials, low-molecular weight materials, dendrimers, oligomer, polymers, hybrid materials, etc. In addition, such materials may be used in the form of various mixtures.

The printing ink composition disclosed herein may be applied by any one coating process selected from spin coating, roll coating, spray coating, dip coating, flow coating, doctor blade coating, dispensing, or the like. More preferably, the printing ink composition is applied to a printing process capable of patterning as well as coating, and such printing processes include inkjet printing, offset printing, gravure printing, gravure-offset printing, flexographic printing, screen printing, pad printing, microcontact printing, stencil printing, imprinting, or the like. the viscosity, solubility and film uniformity of ink Beneficial Effects The printing ink composition for optoelectronic device disclosed herein includes an ammonium carbamate compound or ammonium carbonate compound, which controls the viscosity of ink, the solubility of the materials for optoelectronic device, film uniformity, etc., and is decomposed spontaneously at a sufficiently low temperature after printing, and thus does not adversely affect the quality of the resultant device. Therefore, many compounds having excellent efficiency and lifespan, which, otherwise, are not applicable to printing ink, may be formed into ink suitable for a printing process. As a result, it is possible to provide flexible devices, to realize scale-up of devices, and to improve cost-efficiency.

DETAILED DESCRIPTION OF EMBODIMENTS

The examples will now be described. The following examples are for illustrative purposes only and not intended to limit the scope of this disclosure.

Preparation of Carbamate and Carbonate Compounds

PREPARATION EXAMPLE 1

Preparation of n-butylammonium n-butylcarbamate

Figure 1:
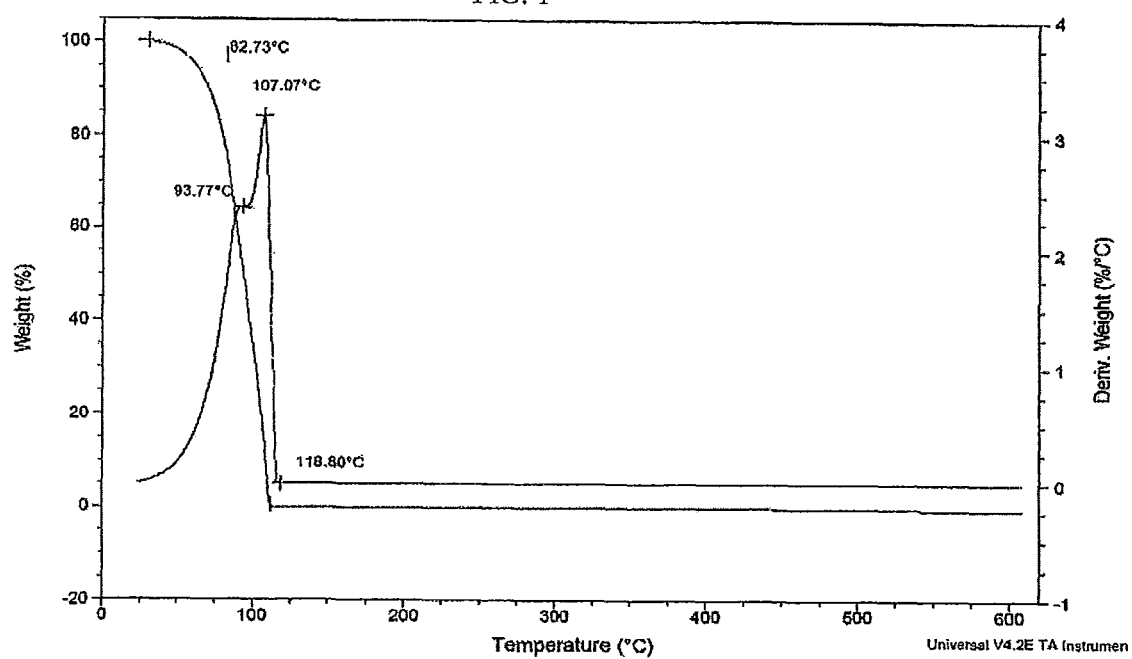
FIG. 1 is a thermal gravimetric analysis (TGA) thermogram of the compound obtained from Preparation Example 1.

To a sealed and pressurized 250 mL reactor equipped with an agitator and a gas inlet, 100 g (1.367 mol) of n-butylamine is introduced and carbon dioxide gas is introduced gradually thereto at room temperature to perform a reaction. As the reaction proceeds, carbon dioxide consumption decreases and the reaction mixture is allowed to react sufficiently until carbon dioxide is not consumed any longer. In this manner, 128.85 g (yield 99%, 0.677 mol) of n-butylammonium n-butyl carbamate is obtained in the form of white powder. The resultant compound is characterized by thermal gravimetric analysis (TGA) and the thermogram is shown in FIG. 1. As can be seen from FIG. 1, the carbamate compound is thermally decomposed completely at a temperature lower than 120° C.

PREPARATION EXAMPLE 2

Preparation of n-octylammonium n-octylcarbonate

To a 250 mL Schlenk flask equipped with an agitator and a gas inlet, 100 g (0.774 mol) of n-.octylamine and 6.97 g (0.387 mol) of purified water are introduced, and 22 g (0.5 mol) of carbon dioxide gas is added gradually thereto while maintaining the temperature at 30° C. or lower by using cooling water. Then, reaction is carried out under agitation for 2 hours. As the reaction proceeds, the viscosity of the reaction mixture increases. Finally, 119.08 g (yield 96%, 0.372 mol) of n-octylammonium n-octylcarbonate is obtained as transparent liquid.

PREPARATION EXAMPLE 3

Preparation of Amylammonium Amylbicarbonate

To a 250 mL Schlenk flask equipped with an agitator and a gas inlet, 100 g (1.147 mol) of amylamine and 20.65 g (1.147 mol) of purified water are introduced and carbon dioxide gas is introduced gradually thereto at room temperature to perform a reaction. As the reaction proceeds, carbon dioxide consumption decreases and the reaction mixture is allowed to react sufficiently until carbon dioxide is not consumed any longer. In this manner, 148.95 g (yield 99%, 1.136 mol) of amylammonium amylbicarbonate is obtained as transparent liquid.

Preparation and Characterization of Printing Ink Composition

EXAMPLE 1

Figure 2:
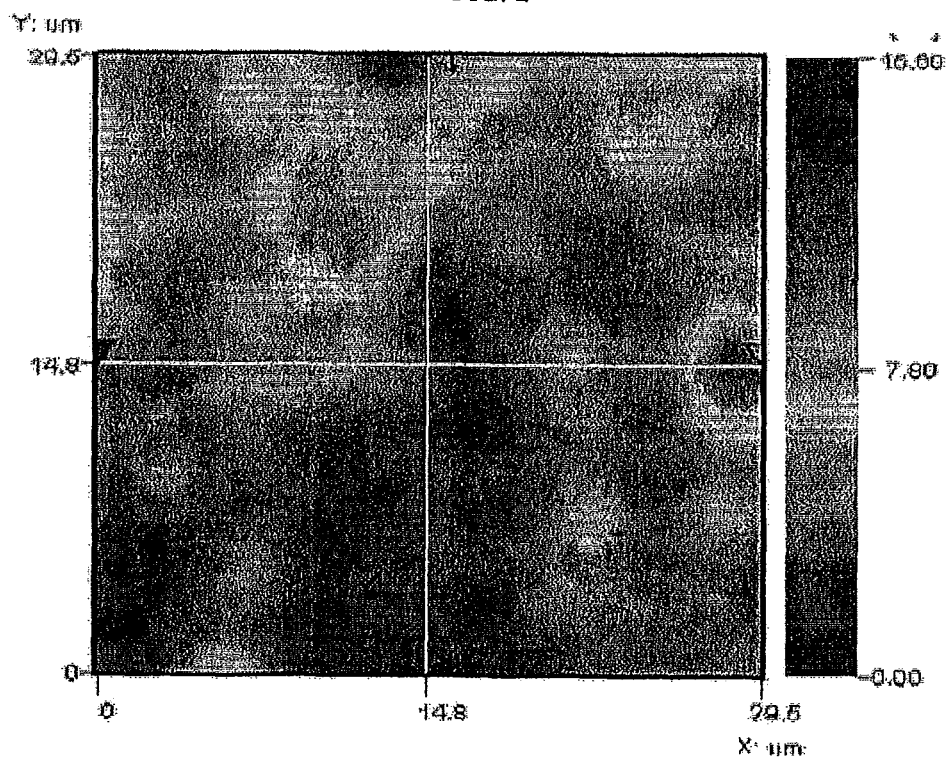
FIG. 2 is an atomic force microscope (AFM) graph showing the surface roughness of a surface formed by printing the composition of Example 1.

To a 10 mL flask equipped with an agitator, 3 g of poly(3,4-ethylenedioxythiophene/poly(styrene sulfonate) (PEDOP/PSS), available from Aldrich Co., 1 g of n-butylammonium n-butylcarbamate obtained from Preparation Example 1 and 3 g of ethanol (Aldrich Co.) are added and the reaction mixture is agitated for 10 minutes at room temperature. Next, the reaction mixture is filtered through a 0.2μ membrane filter to provide a composition for inkjet printing. The resultant composition is determined for its viscosity, surface tension, printability and surface roughness, and the results are shown in Table 3. Inkjet printability is determined with DMP-2813 system. Evaluation of inkjet printability includes printing the composition on a glass substrate to a thickness of 80 nm, drying the composition at 150° C. for 10 minutes, and determining the surface roughness. As shown in FIG. 2, the surface roughness is determined by atomic force microscopy (AFM) after inkjet printing, and it is shown that the surface roughness is high as evidenced by an average Ra value of 1.23 nm.

EXAMPLE 2

To a 20 mL flask equipped with an agitator, 0.1 g of 2,6-bis(4-carbazolestyryl)-ethylhexylanisole (INKTEC Co., Ltd.), 2 g of n-butylammonium n-butylcarbamate obtained from Preparation Example 1, 4 g of methylanisole (Aldrich) and 4 g of acetophenone (Aldrich) are added and the reaction mixture is agitated for 10 minutes at room temperature. Next, the reaction mixture is filtered through a 0.2μ membrane filter to provide a composition for inkjet printing. The resultant composition is determined for its viscosity, surface tension, printability and surface roughness, and the results are shown in Table 3. Inkjet printability is determined with DMP-2813 system and evaluated in the same manner as described in Example 1.

EXAMPLE 3

To a 20 mL flask equipped with an agitator, 0.1 g of 3,3,5,5-tetrakis(4-t-butylstyryl)-4,4-dimethoxybiphenyl (INKTEC Co., Ltd.), 1.5 g of n-octylammonium n-octylcarbonate obtained from Preparation Example 2, 2.5 g of toluene (Aldrich) and 6 g of tetrahydronaphthalene (Aldrich) are added and the reaction mixture is agitated for 10 minutes at room temperature. Next, the reaction mixture is filtered through a 0.2 μ membrane filter to provide a composition for inkjet printing. The resultant composition is determined for its viscosity, surface tension, printability and surface roughness, and the results are shown in Table 3. Inkjet printability is determined with DMP-2813 system and evaluated in the same manner as described in Example 1.

EXAMPLE 4

Figure 3:
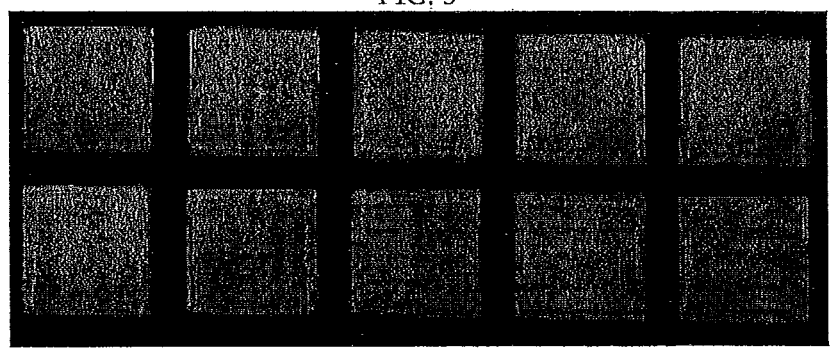
FIG. 3 is a photographic view taken by light emission of a pattern formed by printing the composition of Example 4.

To a 20 mL flask equipped with an agitator, 0.1 g of a green light emitting polymer, SPG-020 (Merck), 3 g of amylammonium amylbicarbonate obtained from Preparation Example 3, 2 g of chlorobenzene (Aldrich) and 5 g of tetrahydronaphthalene (Aldrich) are added and the reaction mixture is agitated for 10 minutes at room temperature. Next, the reaction mixture is filtered through a 0.2 μ membrane filter to provide a composition for inkjet printing. The resultant composition is determined for its viscosity, surface tension, printability and surface roughness, and the results are shown in Table 3 Inkjet printability is determined with DMP-2813 system and evaluated in the same manner as described in Example 1. The composition is subjected to inkjet printing to form a pattern, and the pattern is shown in the photograph of FIG. 3 taken by light emission. As can be seen from FIG. 3, the pattern realizes high-quality green light emission.

EXAMPLE 5

To a 20 mL flask equipped with an agitator, 0.2 g of 4,4',4"-tris(N-(2-naphthyl)-N-phenylamino)triphenylamine, 1.5 g of n-butylammonium n-butylcarbamate obtained from Preparation Example 1, 2 g of toluene (Aldrich), 2 g of chlorobenzene (Aldrich) and 3.5 g of acetophenone (Aldrich) are added and the reaction mixture is agitated for 10 minutes at room temperature. Next, the reaction mixture is filtered through a 0.2 μ membrane filter to provide a composition for inkjet printing. The resultant composition is determined for its viscosity, surface tension, printability and surface roughness, and the results are shown in Table 3. Inkjet printability is determined with DMP-2813 system and evaluated in the same manner as described in Example 1.

EXAMPLE 6

To a 20 mL flask equipped with an agitator, 0.1 g of 2,2',2"-(1,3,5-phenylene)tris(1-phenyl-1H-benzimidazole), 2.5 g of n-butylammonium n-butylcarbamate obtained from Preparation Example 1, 2.5. g of toluene (Aldrich) and 5 g of acetophenone (Aldrich) are added and the reaction mixture is agitated for 10 minutes at room temperature. Next, the reaction mixture is filtered through a 0.2 membrane filter to provide a composition for inkjet printing. The resultant composition is determined for its viscosity, surface tension, printability and surface roughness, and the results are shown in Table 3. Inkjet printability is determined with DMP-2813 system and evaluated in the same manner as described in Example 1.

EXAMPLE 7

To a 200 mL flask equipped with an agitator, 1 g of 2,6-bis(4-carbazolestyryl)-ethylhexylanisole (INKTEC Co., Ltd.), 50 g of n-butylammonium n-butylcarbamate obtained from Preparation Example 1, 25 g of methylanisole (Aldrich) and 25 g of acetophenone (Aldrich) are added and the reaction mixture is agitated for 30 minutes at room temperature. Next, the reaction mixture is filtered through a 0.2 μ membrane filter to provide a composition for microgravure printing. The resultant composition is determined for its viscosity, surface tension, printability and surface roughness, and the results are shown in Table 3. Evaluation of printability includes printing the composition on a PET substrate to a thickness of 80 nm, drying the composition at 150° C. for 10 minutes, and determining the surface roughness.

EXAMPLE 8

To a 200 mL flask equipped with an agitator, 30 g of PEDOT/PSS (Aldrich), 80 g of n-butylammonium n-butylcarbamate obtained from Preparation Example 1 and 30 g of ethanol (Aldrich) are added and the reaction mixture is agitated for 30 minutes at room temperature. Next, the reaction mixture is filtered through a 0.2 μ membrane filter to provide a composition for flexographic printing. The resultant composition is determined for its viscosity, surface tension, printability and surface roughness, and the results are shown in Table 3. Evaluation of printability includes printing the composition on a PET substrate to a thickness of 80 nm, drying the composition at 150° C. for 10 minutes, and determining the surface roughness.

COMPARATIVE EXAMPLE 1

To a 20 mL flask equipped with an agitator, 0.1 g of 2,6-bis(4-carbazolestyryl)ethylhexylanisole (INKTEC Co., Ltd.), 6 g of methylanisole (Aldrich) and 4 g of acetophenone (Aldrich) are added and the reaction mixture is agitated for 10 minutes at room temperature. Next, the reaction mixture is filtered through a 0.2 μ membrane filter to provide a composition for printing. The resultant composition is determined for its viscosity, surface tension, printability and surface roughness, and the results are shown in Table 3. Inkjet printability is determined with DMP-2813 system and evaluated in the same manner as described in Example 1.

COMPARATIVE EXAMPLE 2

To a 20 mL flask equipped with an agitator, 0.1 g of a green light emitting polymer, SPG-020 (Merck), 5 g of chlorobenzene (Aldrich) and 5 g of tetrahydronaphthalene (Aldrich) are added and the reaction mixture is agitated for 10 minutes at room temperature. Next, the reaction mixture is filtered through a 0.2 μ membrane filter to provide a composition for microgavure printing. The resultant composition is determined for its viscosity, surface tension, printability and surface roughness, and the results are shown in Table 3. Evaluation of printability includes printing the composition on a PET substrate to a thickness of 80 nm, drying the composition at 150° C. for 10 minutes, and determining the surface roughness.

TABLE 3

|  | Viscosity (cps) | Surface tension (dyne/cm) | Printability | Surface roughness |
|---|---|---|---|---|
| Example 1 | 8.2 | 33 | Good | Ra: 1.23 nm |
| Example 2 | 9.1 | 32 | Good | Ra: 1.88 nm |
| Comp. Ex. 1 | 0.9 | 31 | Poor | Ra: 4.33 nm |
| Example 3 | 7.5 | 32 | Good | Ra: 1.53 nm |
| Example 4 | 10.6 | 33 | Good | Ra: 2.13 nm |
| Example 5 | 9.4 | 32 | Good | Ra: 2.53 nm |
| Example 6 | 7.9 | 32 | Good | Ra: 1.64 nm |
| Example 7 | 53 | 32 | Good | Ra: 2.87 nm |
| Comp. Ex. 2 | 4.8 | 32 | Poor | Ra: 11.37 nm |
| Example 8 | 212 | 31 | Good | Ra: 3.21 nm |

When comparing Example 2 with Comparative Example 1 in Table 3, it can be seen that the composition of Example 2 including n-butylammonium n-butylcarbamate has a viscosity suitable for inkjet printing, shows excellent printability, and provides significantly improved surface roughness on the surface formed after printing.

In addition, when comparing Example 7 with Comparative Example 2, the composition of Example 7 has higher viscosity than the composition of Comparative Example 2, shows excellent printability when applied to gravure printing, and provides significantly improved surface roughness.

What is claimed is:

1. A method for fabricating an optoelectronic device, comprising:
   directly applying a printing ink composition to a patterning process,
   wherein the printing ink composition consists of (1) at least one compound selected from the group of compounds represented by Chemical Formula 1, Chemical Formula 2, Chemical Formula 3, and mixtures thereof in an amount of 0.01-90 wt % based on the total weight of the composition, (2) at least one organic material for an optoelectronic device, and optionally a solvent:

[Chemical Formula 1]
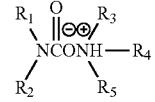

[Chemical Formula 2]
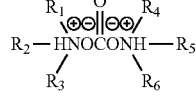

[Chemical Formula 3]
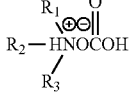

wherein, in Chemical Formulas 1, 2 and 3,
$R_1$ through $R_6$ is independently selected from hydrogen, hydroxy, $C_1$-$C_{30}$ alkoxy, $C_1$-$C_{30}$ alkyl, $C_3$-$C_{30}$ cycloalkyl, $C_6$-$C_{20}$ aryl, ($C_6$-$C_{20}$)ar($C_1$-$C_{30}$)alkyl, functional group-substituted $C_1$-$C_{30}$ alkyl, functional group-substituted $C_6$-$C_{20}$ aryl, heterocyclic compound, polymeric compound and a derivative thereof, wherein when $R_1$ through $R_6$ represents alkyl or aralkyl non-substituted or substituted with a functional group, carbon chain may include a heteroatom selected from N, S and O, and $R_1$ and $R_2$, or $R_4$ and $R_5$ may be independently linked to each other via alkylene with or without a heteroatom to form a ring, with a proviso that not all of $R_1$ through $R_6$ are hydrogens.

2. The method according to claim 1, wherein each of $R_1$ through $R_6$ is independently selected from the group consisting of hydrogen, methyl, ethyl, propyl, isopropyl, butyl, isobutyl, amyl, hexyl, ethylhexyl, heptyl, octyl, isooctyl, nonyl, decyl, dodecyl, hexadecyl, octadecyl, docodecyl, cyclopropyl, cyclopentyl, cyclohexyl, allyl, hydroxy, methoxy, methoxyethyl, methoxypropyl, cyanoethyl, ethoxy, butoxy, hexyloxy, methoxyethoxyethyl, methoxyethoxyethoxyethyl, hexametyleneimine, morpholine, piperidine, piperazine, ethylenediamine, propylenediamine, hexamethylenediamine, triethylenediamine, pyrrole, imidazole, pyridine, carboxymethyl, trimethoxysilylpropyl, triethoxysilylpropyl, phenyl, methoxyphenyl, cyanophenyl, phenoxy, tolyl, benzyl, polyallylamine, polyethyleneamine and derivatives thereof, with a proviso that not all of $R_1$ through $R_6$ are hydrogens.

3. The method according to claim 1, wherein the ammonium carbamate compound represented by Chemical Formula 1 is selected from the group consisting of ethylammonium ethylcarbamate, isopropylammonium isopropylcarbamate, n-butylammonium n-butylcarbamate, isobutylammonium isobutylcarbamate, t-butylammonium t-butylcarbamate, 2-ethylhexylammonium 2-ethylhexylcarbamate, octadecylammonium octadecylcarbamate, 2-methoxyethylammonium 2-methoxyethylcarbamate, 2-cyanoethylammonium 2-cyanoethylcarbamate, dibutylammonium dibutylcarbamate, dioctadecylammonium dioctadecylcarbamate, methyldecylammonium methyldecylcarbamate, hexamethyleneimineammonium hexamethyleneiminecarbamate, morpholinium morpholinecarbamate, pyridinium ethylhexylcarbamate, triethylenediammonium isopropylbicarbamate, benzylammonium benzylcarbamate, triethoxysilylpropylammonium triethoxysilylpropylcarbamate and derivatives thereof, and mixtures thereof.

4. The method according to claim 1, wherein the ammonium carbonate compound represented by Chemical Formula 2 is selected from the group consisting of ethylammonium ethylcarbonate, isopropylammonium isopropylcarbonate, n-butylammonium n-butylcarbonate, isobutylammonium isobutylcarbonate, t-butylammonium t-butylcarbonate, 2-ethylhexylammonium 2-ethylhexylcarbonate, 2-methoxyethylammonium 2-methoxyethylcarbonate, 2-cyanoethylammonium 2-cyanoethylcarbonate, octadecylammonium octadecylcarbonate, dibutylammonium dibutylcarbonate, dioctadecylammonium dioctadecylcarbonate, methyldecylammonium methyldecylcarbonate, hexamethyleneimineammonium hexamethyleneiminecarbonate, morpholineammonium morpholinecarbonate, benzylammonium benzylcarbonate, triethoxysilylpropylammonium triethoxysilylpropylcarbonate, triethylenediammonium isopropylcarbonate and derivatives thereof, and mixtures thereof.

5. The method according to claim 1, wherein the ammonium bicarbonate compound represented by Chemical Formula 3 is selected from the group consisting of isopropylammonium bicarbonate, t-butylammonium bicarbonate, 2-ethylhexylammonium bicarbonate, 2-methoxyethylammonium bicarbonate, 2-cyanoethylammonium bicarbonate, dioctadecylammonium bicarbonate, pyridinium bicarbonate, triethylenediammonium bicarbonate and derivatives thereof, and mixtures thereof.

6. The method according to claim 1, wherein the patterning process is performed by a printing process selected from the group consisting of inkjet printing, offset printing, screen printing, pad printing, gravure printing, flexographic printing, stencil printing and imprinting.

7. The method according to claim 1, wherein the at least one organic material for the optoelectronic device is selected from the group consisting of poly(3,4-ethylenedioxythiophene/poly(styrene sulfonate), 2,6-bis(4-carbazolestyryl)-ethylhexylanisole, 3,3,5,5-tetrakis(4-t-butylstyryl)-4,4-dimethoxybiphenyl, a green light emitting polymer, 4,4',4"-tris(N-(2-naphthyl)-N-phenylamino)triphenylamine, and 2,2',2"-(1,3,5-phenylene)tris(1-phenyl-1H-benzimidazole).

8. The method according to claim 1, wherein the solvent is at least one selected from the group consisting of water, ethanol, methanol, ethylene glycol, methyl acetate, ethyl acetate, diethyl ether, tetrahydrofuran, anisole, methyl anisole, acetone, methyl ethyl ketone, acetophenone, hexane, heptane, benzene, toluene, xylene, tetrahydronaphthalene, methylene chloride, chloroform, carbon tetrachloride and chlorobenzene.

* * * * *